United States Patent [19]
Fujita et al.

[11] Patent Number: 5,249,973
[45] Date of Patent: Oct. 5, 1993

[54] CARD TYPE JUNCTION BOX

[75] Inventors: Yoshinori Fujita; Takuya Inoue, both of Yokkaichi, Japan

[73] Assignee: Sumitomo Wiring Systems, Ltd., Mie, Japan

[21] Appl. No.: 909,676

[22] Filed: Jul. 7, 1992

[30] Foreign Application Priority Data

Jul. 31, 1991 [JP] Japan .................. 3-191736

[51] Int. Cl.⁵ .................................... H01R 9/09
[52] U.S. Cl. .......................... 439/76; 439/66; 439/328
[58] Field of Search ............ 439/61, 74, 75, 76, 439/66, 328; 361/395, 396, 399, 412, 413, 415

[56] References Cited

U.S. PATENT DOCUMENTS

| | | | |
|---|---|---|---|
| 3,200,297 | 8/1965 | Gibson | 361/412 |
| 3,568,001 | 3/1971 | Straus | 361/413 |
| 3,588,852 | 6/1971 | McCormack | 29/604 |
| 4,065,200 | 12/1977 | D'Angelo | 439/377 |
| 4,135,226 | 1/1979 | Kourimsky | 361/415 |
| 4,972,295 | 11/1990 | Suguro et al. | 361/386 |

FOREIGN PATENT DOCUMENTS 58-21391  4/1983  Japan .

*Primary Examiner*—Neil Abrams
*Attorney, Agent, or Firm*—Sughrue, Mion, Zinn, Macpeak & Seas

[57] ABSTRACT

A card type junction box includes a connector receiver for disposing therein one end of at least one pressure contact terminal, and a housing having an insertion opening for inserting therein one or more circuit cards. The circuit card is composed of, for example, a flexible printed circuit (FPC) or a printed circuit board (PCB). The circuit card is inserted and removably disposed in the housing so as to connect the circuit portion of the circuit card with the other end of the pressure contact terminal. The circuit portion of one circuit card may be adapted to be connected with the circuit portion of another circuit card.

4 Claims, 11 Drawing Sheets

CARD TYPE JUNCTION BOX

BACKGROUND OF THE INVENTION

The present invention generally relates to a card type junction box, and more particularly, to a junction box which is interchangeable to be used preferably in an electric wire circuit or the like for motorcars.

Conventionally, in the electric wire circuit for motorcars, in order to simplify the engagement of a 10 wire harness, a junction box was provided to connect, through the above-described circuit, a wire harness 5 with the other wire harness, fuses, relays, etc., which are in turn connected with a connector receiver 4 and so on provided in a housing 3. The housing included therein a circuit having a distributing plate 2 provided with a bar 1 laminated thereon so as to be built in, as shown in FIG. 22.

In a junction box of the above-described type, a pressure contact terminal 6 for connecting fuses and so on is provided integrally with the above-described bus bar 1, disposed within a connector receiver 4. When the above-described circuit changes because of a change in a motorcar type, the distributing plate 2, the housing 3 and so on must be replaced in accordance with the circuit construction. When the circuit is different, the common use of the junction box cannot be effected.

As disclosed in Japanese Patent Publication Tokko-sho No. 58-21391, a junction box of a cassette type for forming a circuit with the distributing plate disposed on the bridge member is proposed with the bridge member capable of being removable within a card type out box being provided.

In the above-described construction, the circuit construction can be changed by a pulling out operation of the bridge member from the out box and the exchange of the distributing plate with a distributing plate having a different circuit being provided on it.

Only the members for forming the housings of the out box, the bridge member and so on can be used in common if the circuit is changed in a junction box of the above-described cassette type. The distributing plates themselves for constructing the circuit must all be exchanged if the circuit changes.

As the bridge member is disposed within the out box and further the distributing plate is mounted on the member as described hereinabove, the amount of materials to be used increases, with a problem in that the cost becomes higher.

SUMMARY OF THE INVENTION

Accordingly, the present invention has been developed with a view to substantially eliminating the above discussed drawbacks inherent in the prior art, and has for its essential object to provide an improved card type junction box.

Another important object of the present invention is to provide an improved junction box, with lower cost, which is capable of coping with changes in the circuit construction by changes in car type with the least amount of member change.

In accomplishing these and other objects, according to one preferred embodiment of the present invention, there is provided a card type junction box which includes a connector receiver for mounting pressure contact terminals, in a parallel condition, on a top face side and/or a bottom face side and also, for disposing first ends of the pressure contact terminals therein, a housing having an insertion opening provided to insert a circuit card for its possible replaceable operation, and a circuit card provided with a circuit portion disposed on a basic material, and which is characterized in that the above-described circuit card is inserted and disposed within the housing through the insertion opening so as to bring the circuit portion thereof into contact with the other end of a corresponding pressure contact terminal in a position corresponding to the circuit portion of the circuit card, and the circuit portion of the circuit card is adapted to be connected with the pressure contact terminal.

The above-described housing is provided with a circuit card guide means for disposing a plurality of circuit cards in a stacked relationship at intervals, the above-described pressure contact terminal has at its one end a contact portion to be disposed within the connector receiver, and has at its other end a curved circuit contact portion. A terminal passing hole is provided in a position corresponding to the desired pressure contact terminal of the circuit card. The circuit contact portion of the desired pressure contact terminal passes through the pressure contact terminal passing hole so as to project onto the side opposite to the pressure contact terminal of the circuit card. Namely, a terminal passing hole is provided on one circuit card in a position corresponding to a desired pressure contact terminal so as to project the circuit contact portion of the desired pressure contact terminal through the terminal passing hole without contacting the one card but for contacting it with the other circuit card.

A through-member having conductivity extending through one, two or more circuit cards is provided, the circuit portion of the desired circuit card is preferably connected with the circuit portion of the other circuit card through the through-member.

The above-described through-member extends through a hole portion provided in a middle circuit card among three adjacent circuit cards, with the circuit portions of the upper and lower circuit cards preferably being connected through the through-member.

The above-described circuit card is preferably composed of a flexible printed circuit (FPC) or a printed circuit board (PCB).

In a card type junction box in accordance with the present invention, the existing circuit card is pulled out from the housing so as to exchange it with a circuit card having a different circuit portion provided thereon, so that the pressure contact terminal comes into contact with the circuit portion provided in a position corresponding to the circuit portion of the exchanged circuit card as the construction is provided as described hereinabove. The circuit construction within the junction box is easily changed simply by exchanging one circuit card and its corresponding circuit portion for a different circuit card.

Especially when one end of the pressure contact terminal is formed as a circular arc-shaped circuit contact portion as described hereinabove, a terminal passing hole is provided in a position corresponding to a desired pressure contact terminal of one circuit card and which does not come into contact with the desired pressure contact terminal so as to project the circuit contact portion of the desired pressure contact terminal through the terminal passing hole. The circuit contact portion passes without coming into contact with the one circuit card but can come into contact with the circuit portion of another circuit card to be positioned onto the side opposite to the pressure contact terminal.

Further, by the provision of a conductive through-member having a through-hole or the like as described hereinabove, the circuit portion of the circuit card which is not connected with the circuit contact portion of the above-described pressure contact terminal can be connected with the circuit portion of the other circuit card.

When the circuit card is composed of an FPC, the circuit card can be made lighter in weight.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
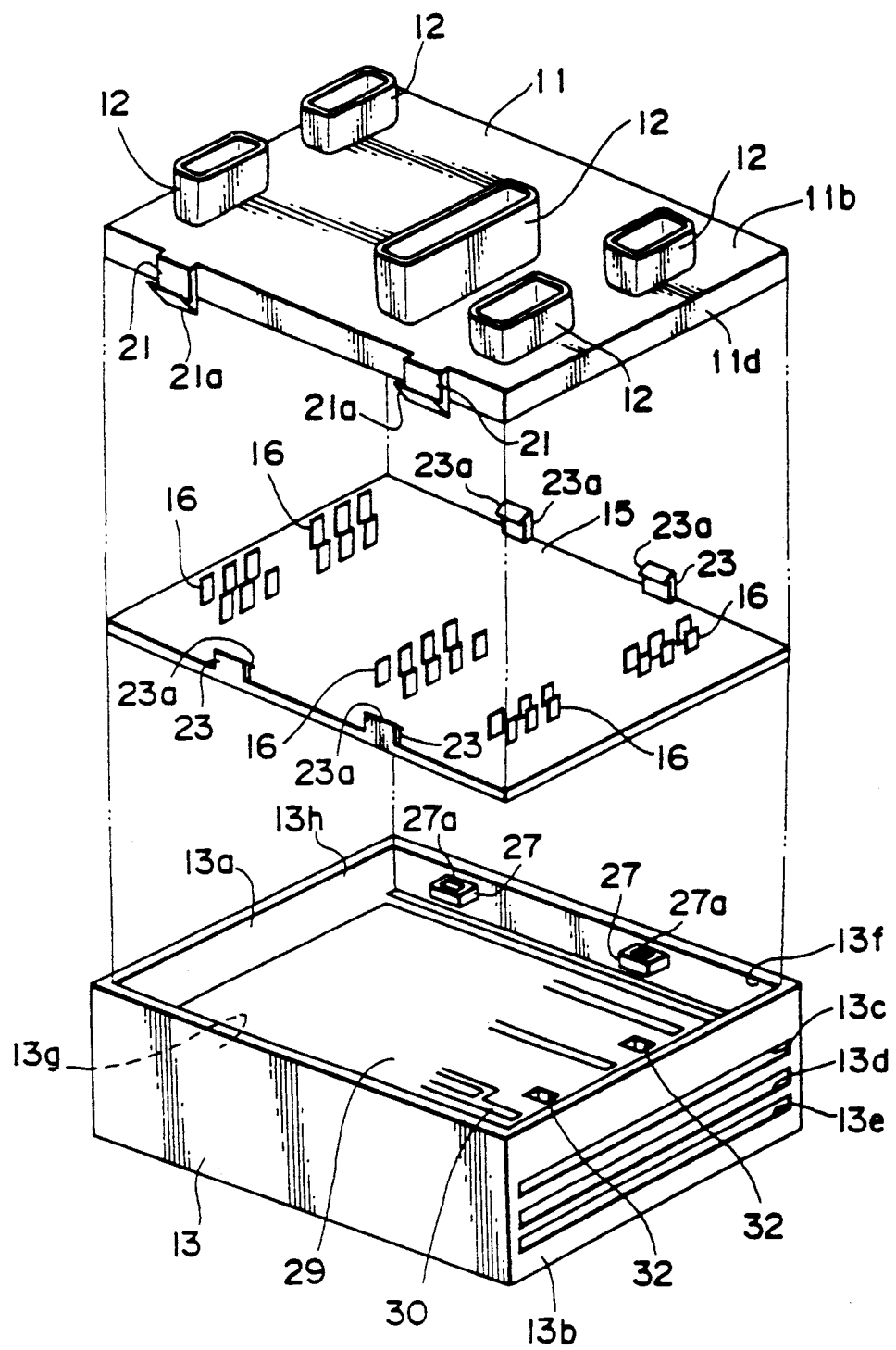
FIG. 1 is a dismantled perspective view showing an embodiment of a card type junction box in accordance with the present invention.

Before the description of the present invention proceeds, it is to be noted that like parts are designated by like reference numerals throughout the accompanying drawings.

Figure 2:
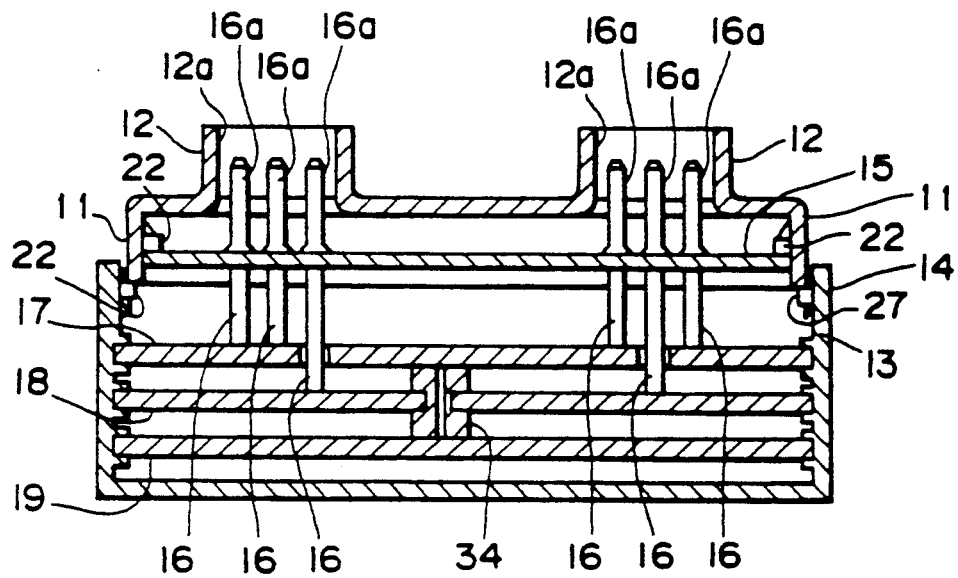
FIG. 2 is a sectional view showing an embodiment.

Referring now to the drawings, there is shown in FIGS. 1 through 13, a junction box according to one preferred embodiment of the present invention, which includes an upper cover with a plurality of connector receivers 12 being provided on it, and a lower cover 13 engaged with the upper cover 11 to compose a housing 14. A terminal sheet 15 is provided on which a plurality of pressure contact terminals 16 are fixed, and also is adapted to be mounted on the above-described upper cover 11. The junction box further includes first, second and third circuit cards 17, 18, 19 (see FIG. 2) which are inserted and removably disposed in the above-described housing 14.

Figure 3:
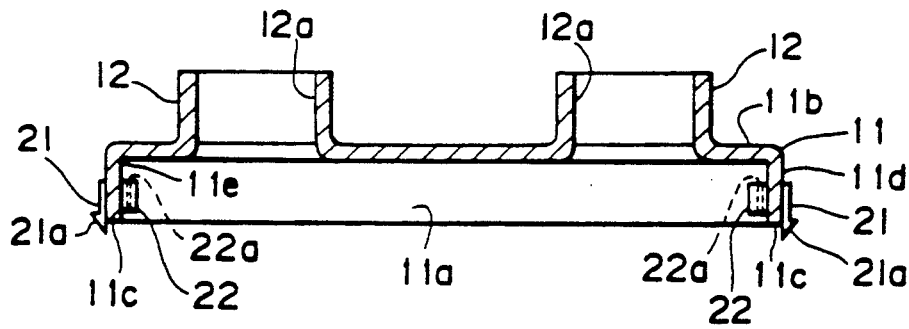
FIG. 3 is a sectional view showing an upper cover.
Figure 4:
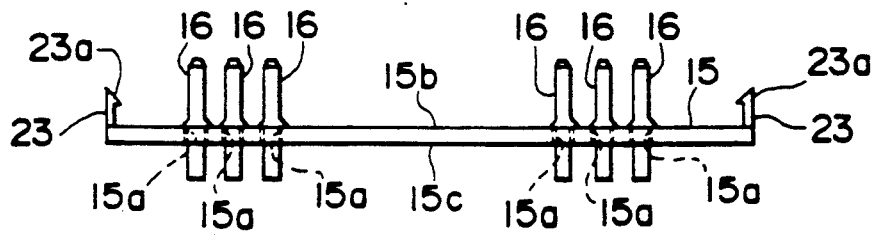
FIG. 4 is a front face view showing a terminal sheet.

The upper cover 11 is approximately rectangular parallelopiped-shaped, as shown in detail in FIG. 3, with its bottom being open to form an opening portion 11a, and also, the plurality of connector receivers 12 project from a top face 11b.

A male-shaped lock portion 21 provided at its tip end with an arrowhead-shaped portion 21a is provided on the outer side 11d of an edge portion 11c of the upper cover 11. When the male-shaped lock portion 21 is inserted from above into a hole portion 27a of a female-shaped lock portion 27 provided on the lower cover 13 as described hereinabove, the arrowhead-shaped portion 21a is engaged with the female-shaped lock portion 27 so as to fix together the upper cover 11 and the lower cover 13.

A female-shaped lock portion 22 formed by a hole portion 22a is provided on the inner side 11e of the edge portion 11c of the upper cover 11. An arrowhead-shaped portion 23a of a male lock portion 23 provided on the terminal sheet 15 is inserted from below into the female-shaped lock portion 22 so as to fix together the upper cover 11 and the terminal sheet 15.

The terminal sheet 15, which is rectangular flat plate-shaped, and the male-shaped lock portions 23 provided with the arrowhead-shaped portions 23a, are projected upwardly into a position opposite to the female-shaped lock portions 22 of the above-described upper cover 11.

A plurality of terminal holes 15a (shown only in FIG. 4), for inserting and fixing the respective pressure contact terminals 16, are extended from a top face 15b side to a lower face 15c side in the terminal sheet 15.

Figure 7:
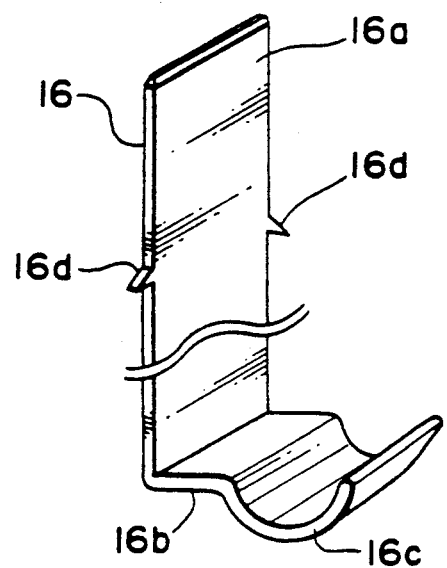
FIG. 7 is a perspective view showing a pressure contact terminal.

In each pressure contact terminal 16 in the present embodiment, as shown in FIG. 7, one tip end portion is provided as a linear male contact portion 16a to be disposed within a corresponding connector receiver 12. The other tip end is bent at an approximately right angle to form a bent portion 16b so as to provide a circuit contact portion 16c formed in a circular arc shape which continues up to the bent portion 16b.

The above-described circuit contact portion 16c comes into contact with the circuit portion 30 of the first circuit card 17 (see FIG. 9) or second circuit card 18 to be described in more detail later, so that the pressure contact terminal 16 may be conducted or electrically connected to the circuit portion 30. The circuit contact portion 16c may be elastically bent at the connection portion with the bent portion 16b so as to come into contact with the circuit portion 30 in an elastically biased condition, so that the pressure contact terminal 16 and the circuit portion 30 are adapted to be positively conductive.

The pressure terminal 16 has a pair of triangular-shaped engagement projections 16d. 16d provided opposite to the width direction so as to prevent the pressure contact terminal 16 from coming off of the terminal hole 15a of the terminal sheet 15.

Figure 5:
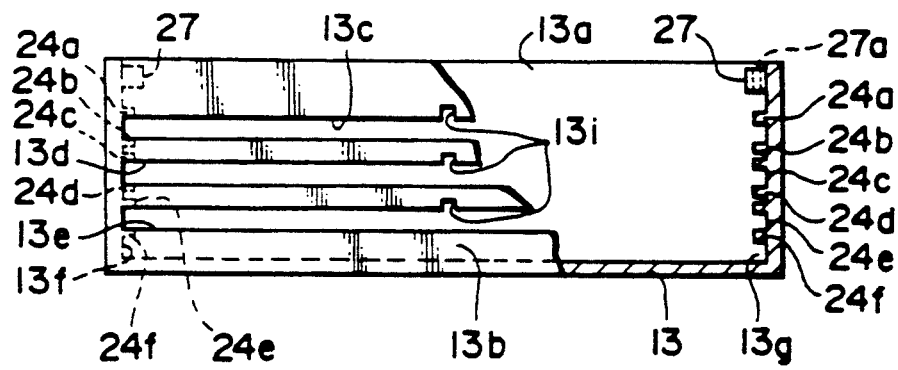
FIG. 5 is a partially broken front view showing a lower cover.

As shown in detail in FIG. 5, the lower cover 13 is approximately rectangular parallelopiped-shaped with the upper side having an opening portion 13a. The rectangular shape defines a pair of short side faces 13b and 13h and a pair of long side faces 13f and 13g, with the side face 13b being proportional in size to the sectional side faces of the circuit cards 17, 18, 19. Insertion openings 13c, 13d, 13e, into which the circuit cards 17, 18, 19 can be inserted, are disposed in parallel at the given intervals in a height direction.

Guides 24a, 24b, 24c, 24d, 24e, 24f which are rectangular in section extend from the side face 13b, having the above-described insertion openings 13c, 13d, 13e provided thereon, to the opposite, short side face 13h of the lower cover 13. The guides constitute guide means and are provided in parallel at intervals in the height direction on the inner side of both the side faces 13f, 13g on the long side of the lower cover 13.

The guides 24a through 24f are respectively disposed in positions where the upper ends or the lower ends of the insertion openings 13c, 13d, 13e are approximately in conformity. When the first, second and third circuit cards 17, 18, 19 are respectively inserted into insertion openings 13c, 13d, 13e, they are guided on the guides 24a through 24f and are disposed in a stacked relationship at intervals within the housing 14 in a mutually parallel condition.

Means 26 for preventing the circuit cards 17, 18, 19 from coming out of the insertion openings 13c, 13d, 13e are provided in positions where they are on the inner side of the side face 13b and are positioned upwardly of the insertion openings 13c, 13d, 13e.

Figure 6:
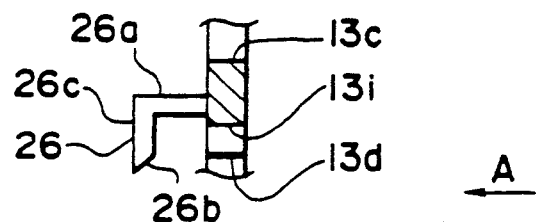
FIG. 6 is a partial sectional view showing a lock means.

Namely, a circuit card lock means 26 is provided in the width direction at the central portion between the insertion opening 13c, on the inner side of the side face 13b, and the insertion opening 13d. The circuit card lock means 26 is composed of an arm portion 26a projecting in a horizontal direction, an engagement portion 26c which is bent downwardly from the arm portion 26a, and an inclined face 26b which is provided on the tip end portion so as to face the insertion opening, in this case opening 13d is shown in FIG. 6.

The tip end portion of the engagement portion 26c of the circuit card lock means 26 projects slightly into the upper end of the insertion opening 13d. When the second circuit card 18 is inserted through the insertion opening 13d, the inclined face 26b comes into contact with the upper face of the second circuit card 18 to elastically bend the arm portion 26a. When the second circuit card 18 is completely accommodated within the housing 14, the tip end portion is engaged into the lock hole 31 (see FIG. 11) provided in the second circuit card 18 so as to prevent the second circuit card 18 from coming out of the insertion opening 13d. In order to release the engagement between the engagement portion 26c and the lock hole 31, the arm portion 26a is bent upwardly from outside the housing 14 to pull out the engagement portion 26c from the lock hole 31. For this purpose, a notch portion 13i is provided at a position opposite to the engagement portion 26c of the side face 13b, thereby to permit access to the lock means 26.

The above-described lock means 26 is likewise provided on the portion above the insertion openings 13c, 13e of the side face 13b so as to prevent the first circuit card 17 and the third circuit card 19, respectively, from coming out.

The female-shaped lock portions 27 are provided, in positions opposite to the male-shaped lock portions 21 of the upper cover 11, on the inner side of each of the side faces 13f, 13g on the longer side of the lower cover 13.

In the present embodiment, the first, second and third circuit cards 17, 18, 19 are composed of a flexible printed circuit (FPC).

Figure 8:
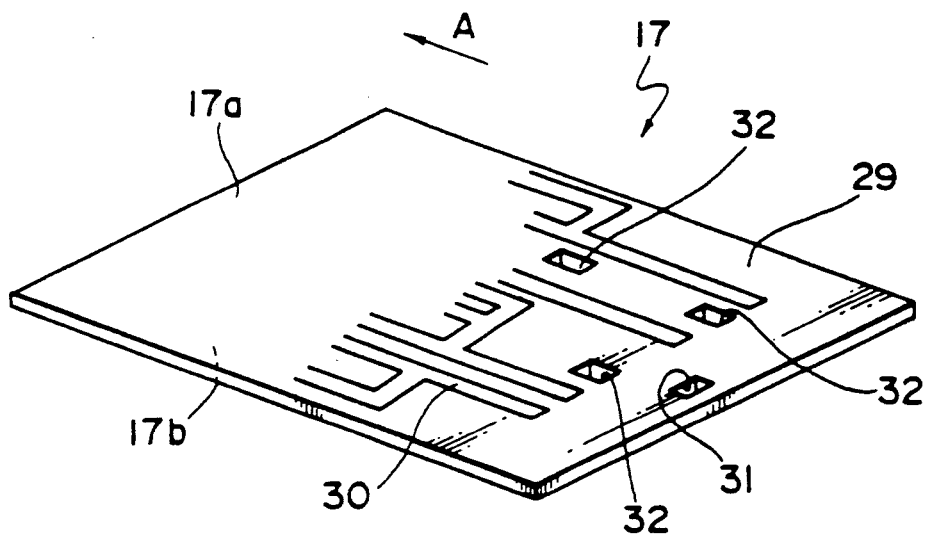
FIG. 8 is a perspective view showing a first circuit card.
Figure 9:
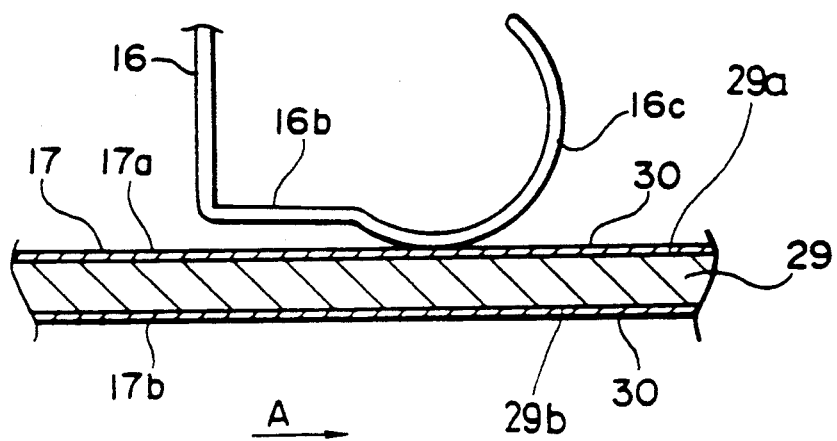
FIG. 9 is a sectional view showing the contact condition between the circuit contact portion of the pressure contact terminal and the first circuit card.

The circuit cards 17, 18, 19 have copper leaf printed circuit portions 30, 30 formed on both the faces 29a, 29b of a film 29 for constituting a basic material with a flexible material being formed into a rectangular shape (see FIGS. 8 and 9).

In order to construct the circuit cards 17, 18, 19, circuit portions 30, 30 are respectively printed on separate films and they are pasted on both the faces 29a, 29b of the film 29. Thereafter, the film, initially having the circuit portion 30 printed thereon, is removed.

Figure 13:
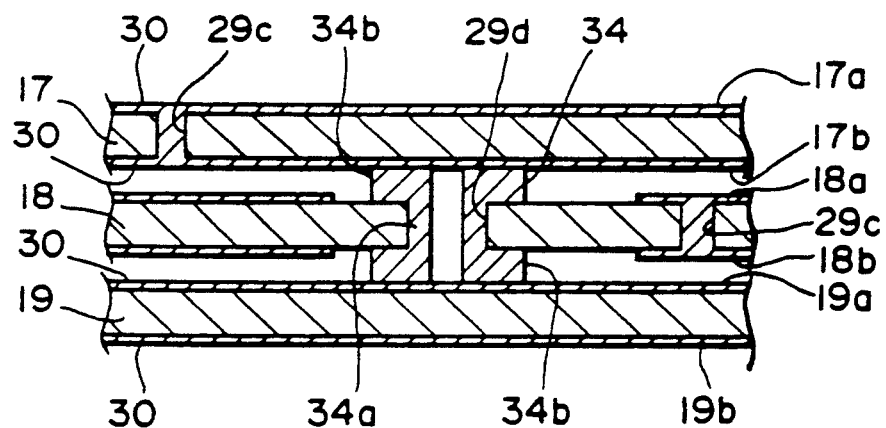
FIG. 13 is a sectional view showing the connection between the first circuit card and the second circuit card by the through-member.

A hole portion 29c is provided previously in a desired position on the film 29 (see FIG. 13). The circuit portions 30, 30 on the upper face 29a and the lower face 29b of the film 29 are connected with each other through the hole portion 29c by means of ultrasonic welding or the like (see FIG. 10).

Insertion of the circuit cards 17, 18, 19 is effected through the insertion openings 13c, 13d, 13e of the lower cover 13 in a given direction shown by an arrow A in the drawings. The lock hole 31, into which the engagement portion 26c of the above-described lock means 26, is drilled. The circuit cards are guided by the guides 24a through 24f and are disposed within the housing 14.

As shown in FIG. 8, a terminal passing hole 32 extending from the upper face 17a to the lower face 17b is provided, in the first circuit card 17, in a desired position corresponding to the circuit contact portion 16c of the pressure contact terminal 16.

When the first circuit card 17 is inserted through the insertion opening 13c and is disposed within the housing 14 as described hereinabove, a circuit contact portion 16c of a respective pressure contact terminal 16 comes into contact with the circuit portion 30 as shown in FIG. 9, so that the pressure contact terminal 16 becomes conductive to the circuit portion 30. When the circuit contact portion 16c is elastically bent, the circuit contact portion 16c is positively depressed on the circuit portion 30 because of the elasticity of the contact portion 16c and the flexibility of the film 29 itself.

Figure 10:
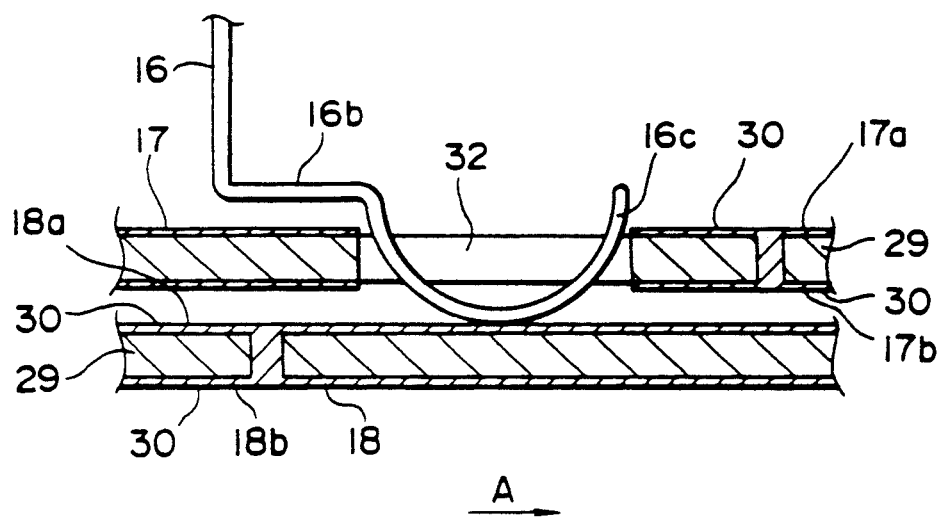
FIG. 10 is a sectional view showing the contact condition between the circuit contact portion of the pressure contact terminal and a second circuit card.

At the location of the above-described terminal passing hole 32, the circuit contact portion 16c of the pressure contact terminal 16 moves, as shown in FIG. 10, into the terminal passing hole 32 and passes without contacting the circuit portion 30 of the first circuit card 17 and is adapted to come into contact with the circuit portion 30 on the top face 18a side of the second circuit card 18.

Figure 11:
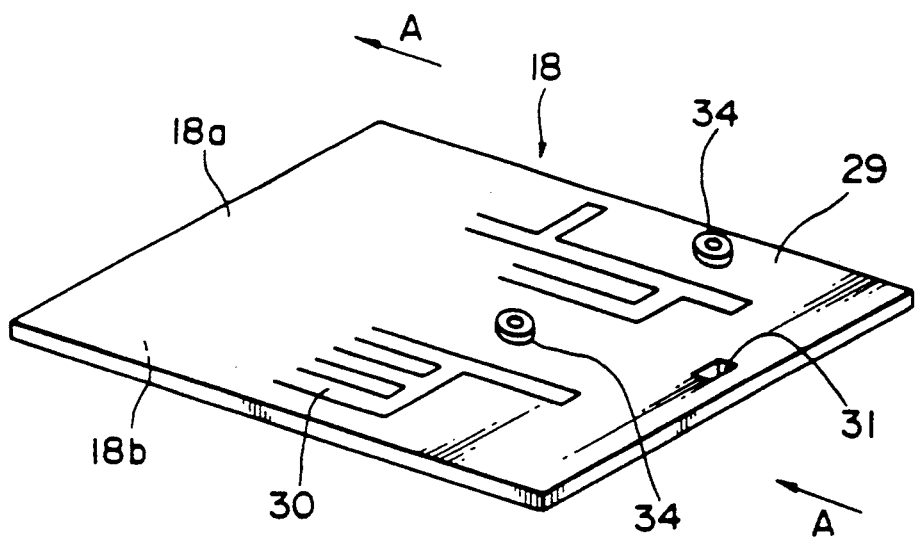
FIG. 11 is a perspective view showing the second circuit card.

A circuit portion 30 is provided on the second circuit card 18, shown in detail in FIG. 11, on both the top face 18a and the bottom face 18b as in the above-described first circuit card 17. Also, the second circuit card 18 has a through-member 34, in a desired location, with a circuit portion 30 on the lower face 17b side of the above-described first circuit card 17 being connected with a circuit portion 30 on the side of the top face 19a of the third circuit card 19.

Figure 12:
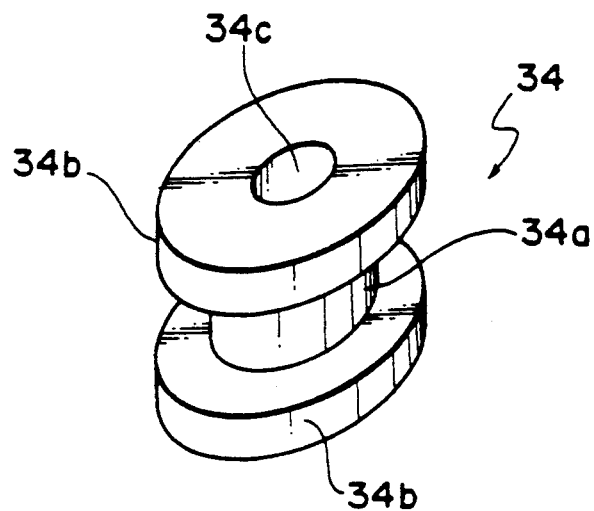
FIG. 12 is a perspective view showing a through-member.

The above-described through-member 34 is made of a material having conductivity. As shown in FIG. 12, disc portions 34b, 34b of a larger diameter than a short cylindrical portion 34a are provided on both the ends of the short cylindrical portion 34a which has a height that is almost equal to the thickness of the second circuit card 18, and a through-hole 34c extending through in an axial direction is provided.

The through-member 34 extends through a hole portion 29d disposed in a location where the circuit portion 30 of the film 29 of the second circuit card 18 is not provided, so that the disc portions 34b, 34b respectively conduct the circuit portion 30 on the lower face 17b side of the first circuit card 17 with the circuit portion 30 on the top face 19a side of the third circuit card 19.

In the present embodiment, as described hereinabove, the circuit contact portion 16c of the pressure contact terminal is connected with the circuit portion 30 on the top face side of the first circuit card 17 or the second circuit card 18, and also, the through-member 34 connects the circuit portion 30 on the lower face 17b side of the first circuit card 17 with the circuit portion 30 on the top face 19a side of the third circuit card 19. In addition, the circuit portion 30 on the upper face side of the respective circuit cards 17, 18, 19 is adapted to be connected with the circuit portion 30 in the lower face side through the hole portion 29c provided in the film 29, so that the desired circuit can be formed with the circuit portion 30 provided on the lower face and the upper face of the first, second and third circuit cards 17, 18, 19.

In order to assemble a card type junction box of the present embodiment, a terminal sheet 15, with the required pressure contact terminals 16 being inserted and retained in the terminal holes 15a, is engaged through the opening portion 11a into the upper cover 11, the male-shaped lock portion 23 of the terminal sheet 15 is locked into the female-shaped lock portion 22 of the upper cover 11, so that the terminal sheet 15 is mounted on the upper cover 11.

The above-described upper cover 11 is engaged into the lower cover 13, the male-shaped lock portion 21 of the upper cover 11 is locked into the female-shaped lock portion 27 of the lower cover 13 so as to fix the upper cover 11 and the lower cover 13 for constructing the housing 14.

The first, second and third circuit cards 17, 18, 19 are inserted into the housing 13 in a direction shown with the above-described arrow A through the insertion openings 13c, 13d, 13e, respectively.

When the first circuit card 17 is inserted through the insertion opening 13c, a corresponding pressure contact terminal 16 is elastically bent in the connection portion between the circuit contact portion 16c and the bent portion 16b as shown in FIG. 9, so that the insertion of the first circuit card 17 is not prevented.

At the location of the terminal passing hole 32, the pressure contact terminal 16 is restored to the original condition in the connection portion between the circuit contact portion 16c and the bent portion 16b as described above with respect to FIG. 10, and the circuit contact portion 16c comes into contact with the circuit portion 30 on the upper face side of the second circuit card 18.

When the first circuit card 17 is inserted in the direction of the arrow A from the condition of FIG. 10, the circuit contact 16c of the pressure contact terminal 16 is elastically bent above in the drawing again, so that the insertion of the first circuit card 17 is not prevented.

When the first circuit card 17 is inserted from the insertion opening 13c to the side face 13h on the short side opposite to the insertion opening 13c, the circuit contact portion 16c of each pressure contact terminal 16 can be input into contact with the circuit portion 30 on the side of the upper face 17a of the first circuit card 17 in the desired position or with the circuit portion 30 on the upper face 18a side of the second circuit card 18 within the desired terminal passing hole 32.

In order to exchange the first, second and third circuit cards 17, 18, 19, the operation is effected as follows.

When, for example, the second circuit card 18 is exchanged in accordance with the change of the clock design, first, the arm portion 26a of the lock means 26 is bent upwardly so as to deviate the engagement portion 26c from the lock hole 31.

The second circuit card 18 is pulled out from the insertion opening 13d, and instead, a circuit card having a different circuit portion formed thereon is inserted and is disposed within the housing 14. At this time, the circuit contact portion 16c of the pressure contact terminal 16 in a portion corresponding to the different circuit portion comes into contact with the circuit portion, so that the circuit portion may be changed.

As described hereinabove, in the present embodiment, the circuit construction may be easily changed by the exchange of the circuit cards 17, 18, 19.

The present invention can be varied and is not limited to the above-described embodiment.

Although three circuit cards are adapted to be disposed within the housing 14 in the above-described embodiment, the number of the circuit cards is not restricted to three, and may be one or more. When the number of the circuit cards is two or more, the connection between the circuit portions of each circuit card can be obtained by the above-described through-member about a third circuit card and subsequent cards through the contact portion of the pressure contact terminal.

Although in the above-described embodiment, a connector receiver was provided with the terminal being disposed only on the upper cover 11, the pressure contact terminal only has to be mounted with the terminals being provided in parallel in the housing 14.

The above-described circuit card is not restricted to the above-described FPC, and may be composed of, for example, a printed circuit board (PCB) and so on.

Figure 14:
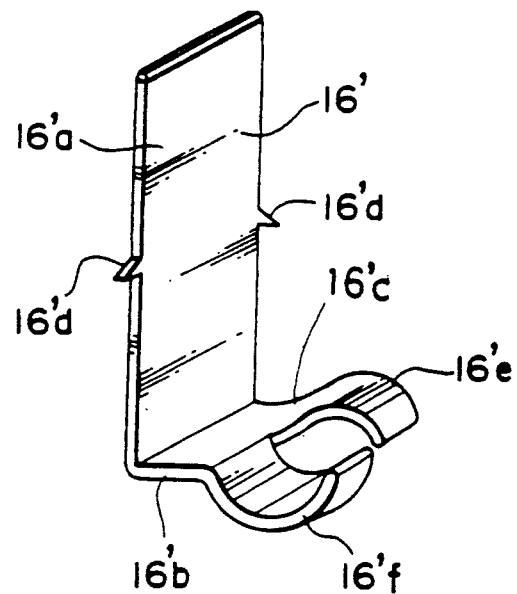
FIG. 14 is a perspective view showing the other embodiment of the pressure contact terminal.
Figure 15:
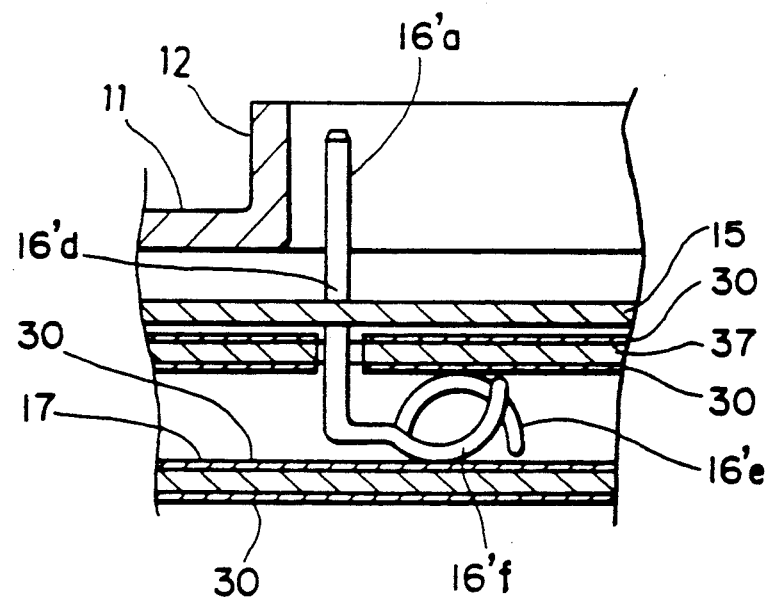
FIG. 15 is a sectional view showing the condition of the pressure contact terminal of FIG. 14 when in use.

The shape of the pressure contact terminal is not restricted to the above description. It may be shaped as in the pressure contact terminal 16' shown in, for example, FIG. 14.

The pressure contact terminal 16' has the portion of the circuit contact portion 16'c divided into two equal portions in the width direction. One is formed as a first circuit contact 16'e curved on the lower side, and the other is formed as a second circuit contact portion 16'f curved on the upper side.

When the pressure contact terminal 16' is used, a fixing circuit card 37 with a circuit portion 30 which does not have to be changed with respect to the circuit contact portion 16'c and the terminal sheet 15, is disposed so as to connect the above-described second circuit contact portion 16'f with the circuit portion 30 of the lower face side of the fixing circuit card 37.

Figure 16:
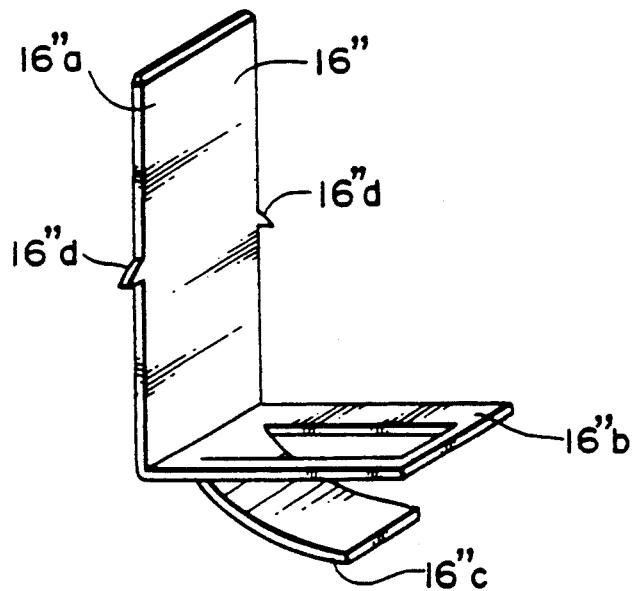
FIG. 16 is a perspective view showing the other embodiment of the pressure contact terminal.

The operation may also be effected from the tip end side to downwardly bend, in a circular arc shape in the width direction, a central portion of the bent portion 16"b, as in the pressure contact terminal 16" shown in FIG. 16 so as to form the circuit contact portion 16"c.

Figure 17:
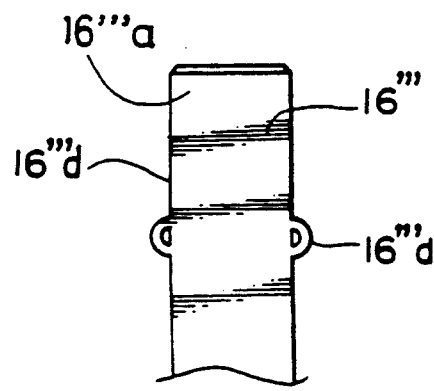
FIG. 17 is a partial front face view showing the other embodiment of the pressure contact terminal.

Further, the engagement projections 16'''d, 16'''d may be made semicircular, ring-shaped as in the pressure contact terminal 16''' shown in FIG. 17.

Figure 18:
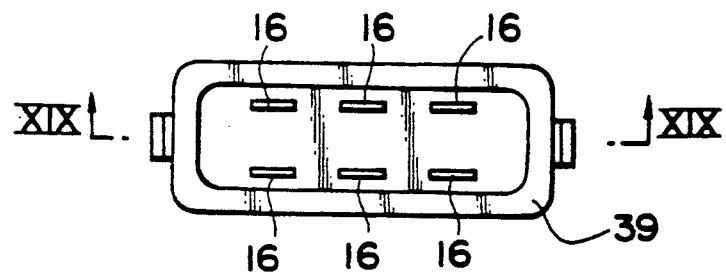
FIG. 18 is a plan view showing a replaceable connector.
Figure 19:
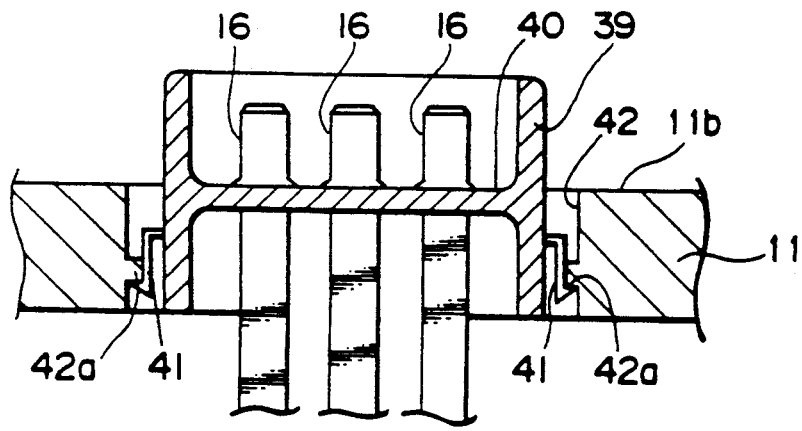
FIG. 19 is a sectional view taken along a line of XIX—XIX of FIG. 18.

The construction of the connector receiver may be provided as a separate member which allows removal of the connector receiver together with the pressure contact terminals 16, as shown in FIG. 18 and FIG. 19, without restriction to the above-described embodiment.

The above-described connector receiver 39 has a terminal insertion portion 40, instead of a terminal sheet 15 as in the above-described embodiment, for fixedly inserting the pressure contact terminals 16 of the terminal insertion portion, and is provided with a lock means 41 on the outer peripheral portion. An engagement hole 42 for inserting thereinto the connector receiver 39 is provided so as to engage the above-described lock means 41 with the lock projection 42a provided in the engagement hole 42, so that the connector receiver 39 is adapted to be mounted on the upper cover 11.

In the case of the construction using the above-described connector receiver 39, the number of the terminals of one connector can be easily changed in accordance with the change of the circuit construction. In the condition of, for example, FIG. 18 and FIG. 19, the connector receiver 39 includes six pressure contact terminals 16. However, the connector receiver 39 may instead be provided with eight pressure contact terminals 16.

Figure 20:
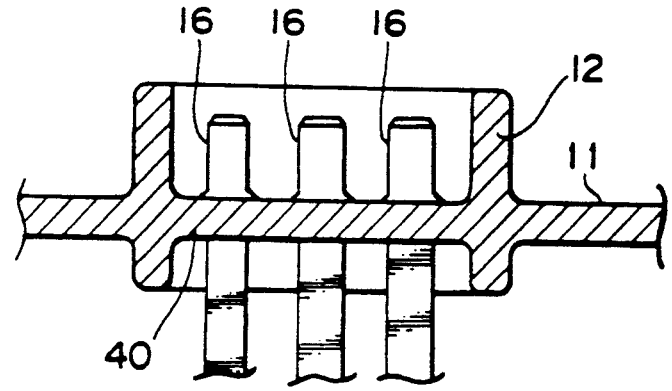
FIG. 20 is a sectional view showing the other embodiment of a connector.

As shown in FIG. 20, a pressure contact terminal insertion portion 40 is provided in a connector receiver 12 formed integrally with the upper cover 11 so that the pressure contact terminals 16 may be disposed directly on the upper cover 11.

Figure 21:
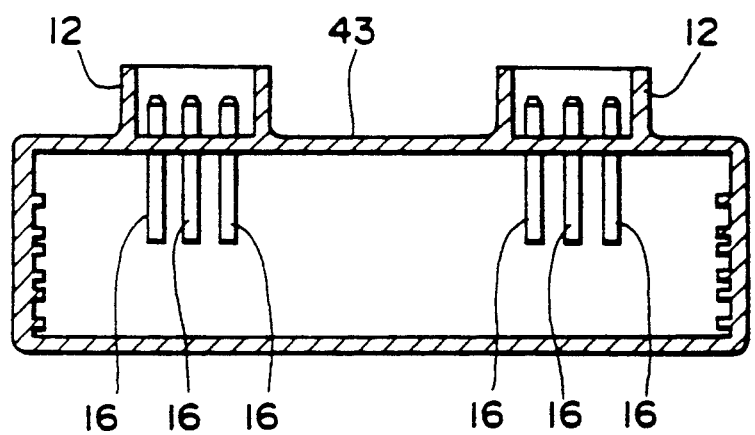
FIG. 21 is a sectional view showing an integral type of housing.
Figure 22:
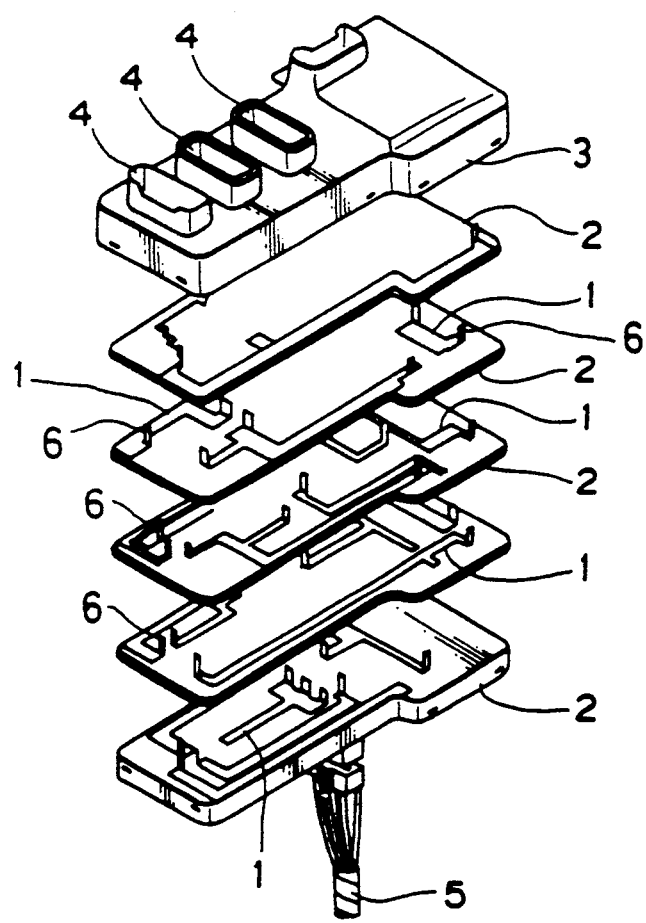
FIG. 22 is a dismantled perspective view showing the conventional wire harness.

In the above-described embodiment, the housing 14 is composed of an upper cover 11 and a lower cover 13. As shown in FIG. 21, the housing 43 may be an integral, one-piece construction. In this case, when the housing 14 is formed, the pressure contact terminals 16 are disposed within a metallic mold so as to dispose the casting in the pressure contact terminal. When the housing is integral in type as described hereinabove, the number of the parts can be reduced.

As is clear from the foregoing description, according to the arrangement of the present invention, the card type junction box includes a circuit card to be inserted and removably disposed in the housing. The circuit card includes a circuit portion formed thereon and is designed to be removably disposed in the housing so that pressure contact terminals are connected with the circuit portion. The circuit construction is easily changed by simply exchanging one circuit card for another circuit card having a different circuit portion provided thereon. Therefore, the circuit construction is different with the type and grade being different, and the circuit card which must be exchanged to effect the change is the only component that needs to be exchanged, the housing and the other circuit cards can be used in common.

The present invention is adapted to replace the circuit card itself including the circuit portion provided on the card. Since the member for retaining the circuit is provided separately, the material cost can be reduced accordingly and the above-described common use can be realized.

In the present invention, when the circuit card is composed of FPC, various advantages such as a lighter weight can be effected, and so on.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A card-type electrical junction box comprising:
   a) a housing having a box-like shape defining a top face, a bottom face, opposing lateral side faces and front and rear side faces, said housing including a plurality of insertion openings formed in said front face;
   b) a plurality of connector receivers projecting outwardly from one of said top face and said bottom face of said housing;
   c) a plurality of pressure contact terminals mounted to said housing in parallel relationship with each other, each pressure contact terminal having a first end and an opposite, second end, said first end extending into a corresponding connector receiver, and said second end extending within said housing and having a curved circuit contact portion;
   d) guide means formed within said housing at spaced apart intervals in correspondence with said insertion openings; and
   e) a plurality of circuit cards respectively inserted through said insertion openings and being removably disposed within said housing by said guide means in stacked arrangement, each circuit card including a circuit portion;
   f) wherein said plurality of circuit cards includes at least an upper circuit card and a lower circuit card, said second ends of certain of said pressure contact terminals contacting said circuit portion of said upper circuit card, said upper circuit card including at least one terminal passing hole formed therethrough in a position corresponding to a selected one of said pressure contact terminals, such that said curved contact portion of the selected pressure contact terminal passes through said terminal passing hole in said upper circuit card and contacts said circuit portion of said lower circuit card.

2. The card-type electrical junction box as defined in claim 1, further comprising a circuit card lock means disposed proximate to each insertion opening and for engaging a lock hole formed in a corresponding circuit card, thereby to prevent the corresponding circuit card from coming out of the corresponding insertion opening.

3. The card-type electrical junction box as defined in claim 1, further comprising a conductive through-member extending through at least one intermediate circuit card and for connecting the circuit portion of said upper circuit card disposed above the intermediate circuit card with the circuit portion of said lower circuit card disposed below the intermediate circuit card.

4. The card-type electrical junction box as defined in claim 1, wherein each circuit card is composed of a flexible printed circuit (FPC) or a printed circuit board (PCB).

* * * * *